(12) United States Patent
Wu et al.

(10) Patent No.: US 11,177,180 B2
(45) Date of Patent: Nov. 16, 2021

(54) PROFILE CONTROL OF A GAP FILL STRUCTURE

(71) Applicant: Taiwan Semiconductor Manufacturing Co., Ltd., Hsinchu (TW)

(72) Inventors: Wan-Yao Wu, Hsinchu (TW); Chang-Yun Chang, Taipei (TW); Ming-Chang Wen, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 17 days.

(21) Appl. No.: 16/787,963

(22) Filed: Feb. 11, 2020

(65) Prior Publication Data
US 2021/0249309 A1    Aug. 12, 2021

(51) Int. Cl.
| H01L 21/00 | (2006.01) |
| H01L 21/8234 | (2006.01) |
| H01L 27/088 | (2006.01) |
| H01L 29/40 | (2006.01) |

(52) U.S. Cl.
CPC ............ *H01L 21/823437* (2013.01); *H01L 21/823431* (2013.01); *H01L 21/823468* (2013.01); *H01L 27/0886* (2013.01); *H01L 29/401* (2013.01)

(58) Field of Classification Search
CPC ..... H01L 21/823431; H01L 21/823437; H01L 21/823456; H01L 21/823468; H01L 27/0886; H01L 29/0649; H01L 29/4238; H01L 29/66795; H01L 29/785; H01L 29/7851
See application file for complete search history.

(56) References Cited

U.S. PATENT DOCUMENTS

| 9,093,530 | B2* | 7/2015 | Huang | H01L 21/30604 |
| 9,171,929 | B2* | 10/2015 | Lee | H01L 21/823821 |
| 9,214,555 | B2* | 12/2015 | Oxland | H01L 29/785 |
| 9,236,267 | B2* | 1/2016 | De | H01L 21/3088 |
| 9,520,482 | B1* | 12/2016 | Chang | H01L 21/823437 |
| 9,548,303 | B2* | 1/2017 | Lee | H01L 21/823878 |
| 9,564,489 | B2* | 2/2017 | Yeo | H01L 29/165 |
| 9,564,530 | B2* | 2/2017 | Fang | H01L 21/3105 |
| 9,576,814 | B2* | 2/2017 | Wu | H01L 21/3086 |
| 9,601,342 | B2* | 3/2017 | Lee | H01L 21/823412 |
| 9,608,116 | B2* | 3/2017 | Ching | H01L 21/823481 |

(Continued)

*Primary Examiner* — Laura M Menz
(74) *Attorney, Agent, or Firm* — Sterne, Kessler, Goldstein & Fox P.L.L.C.

(57) ABSTRACT

The present disclosure describes a method of fabricating a semiconductor structure that includes forming a gate structure over a substrate, forming an interlayer dielectric structure surrounding the gate structures, and forming a first opening in the gate structure and the interlayer dielectric structure. The first opening has a first portion in the gate structure and a second portion in the interlayer dielectric structure, in which the first portion has a width larger than the second portion. The method further includes depositing a dielectric layer in the first opening and forming a second opening over the first opening. The first portion of the opening remains open and the second portion of the opening is filled after depositing the dielectric layer. The second opening in the gate structure has a depth larger than the first opening in the gate structure.

20 Claims, 13 Drawing Sheets

(56) References Cited

U.S. PATENT DOCUMENTS

| | | | |
|---|---|---|---|
| 10,679,936 B2* | 6/2020 | Wei | H01L 21/7685 |
| 11,037,787 B2* | 6/2021 | Wen | H01L 21/3086 |
| 2015/0372144 A1* | 12/2015 | Fang | H01L 21/823821 |
| | | | 257/192 |
| 2016/0056181 A1* | 2/2016 | Anderson | H01L 21/845 |
| | | | 257/347 |
| 2019/0148539 A1* | 5/2019 | Yang | H01L 21/823821 |
| | | | 257/401 |
| 2019/0164837 A1* | 5/2019 | Hung | H01L 27/0886 |
| 2019/0164838 A1* | 5/2019 | Chang | H01L 29/0649 |
| 2019/0221653 A1* | 7/2019 | Hsiao | H01L 29/0649 |
| 2019/0267374 A1* | 8/2019 | Hung | H01L 21/31116 |
| 2019/0386002 A1* | 12/2019 | Wu | H01L 29/0649 |
| 2019/0393324 A1* | 12/2019 | Chen | H01L 21/76816 |
| 2020/0006075 A1* | 1/2020 | Wang | H01L 29/0649 |
| 2020/0006354 A1* | 1/2020 | Wen | H01L 27/0924 |
| 2020/0043735 A1* | 2/2020 | Wen | H01L 21/3086 |
| 2020/0083220 A1* | 3/2020 | Park | H01L 21/823437 |
| 2020/0312843 A1* | 10/2020 | Xie | H01L 21/823437 |
| 2021/0057530 A1* | 2/2021 | Yu | H01L 21/28562 |

* cited by examiner

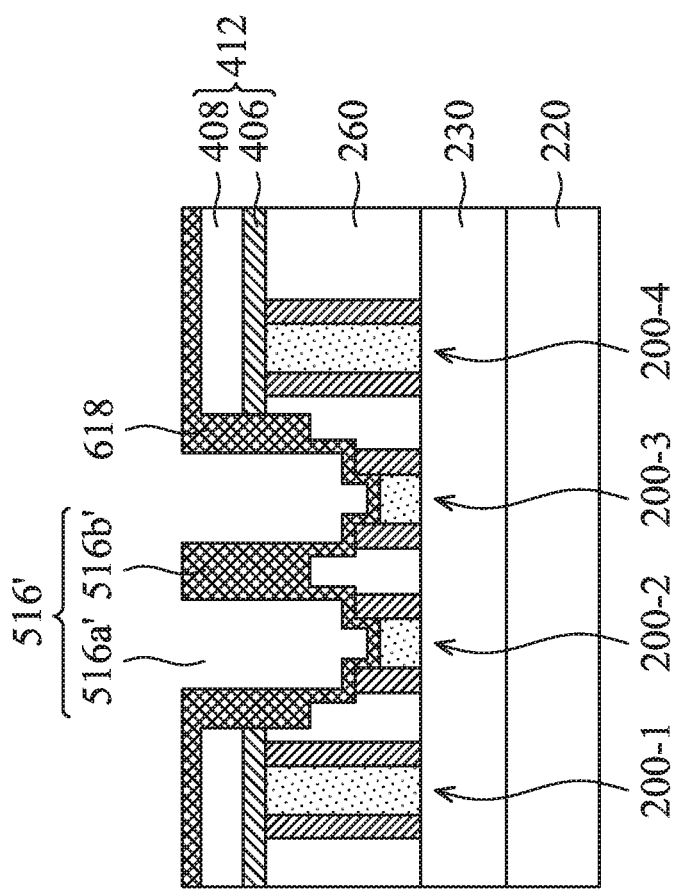
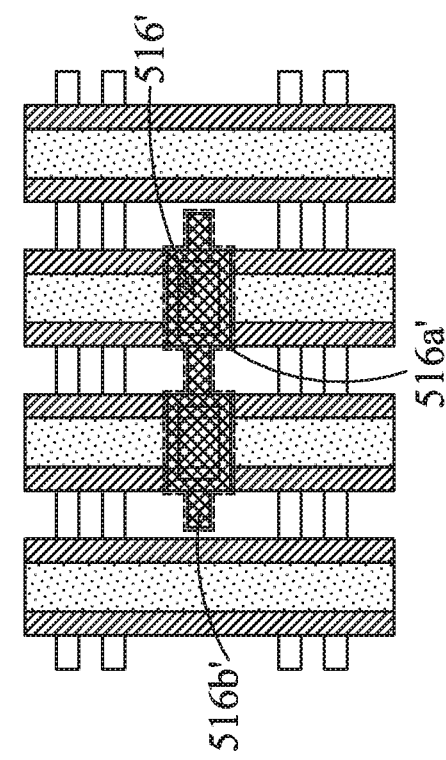
Fig. 6A
Fig. 6B

PROFILE CONTROL OF A GAP FILL STRUCTURE

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 4A-D, 5A-D, 6A-D, and 7A-D are top and cross sectional views describing various processing steps for the formation of a gap fill structure with profile control, in accordance with some embodiments.

DETAILED DESCRIPTION

Figure 1:
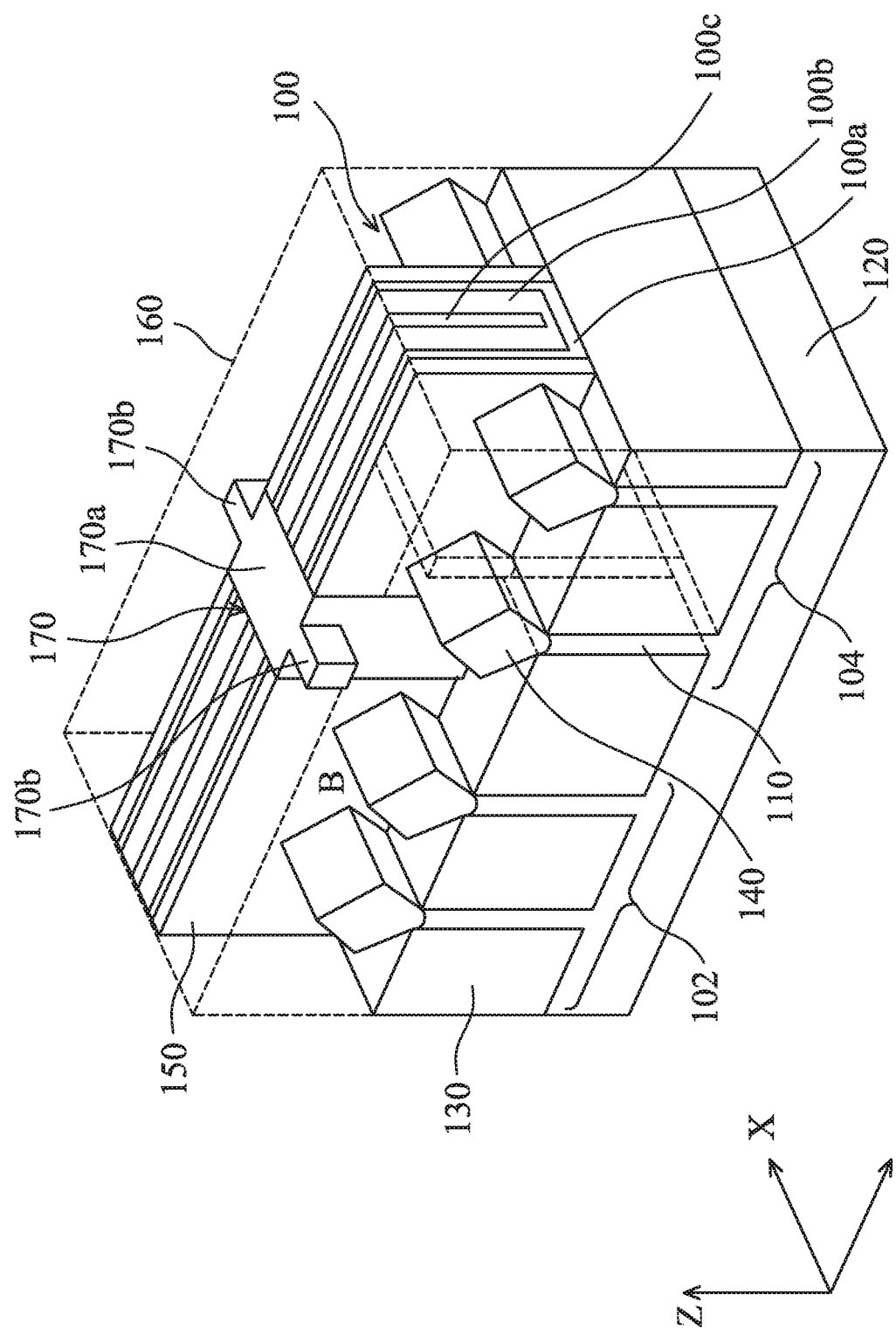
FIG. 1 is a partial isometric view of a gate structure separated by a gap fill structure with profile control, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "etch selectivity" refers to the ratio of the etch rates of two different materials under the same etching conditions.

As used herein, the term "vertical," means nominally perpendicular to the surface of a substrate.

In some embodiments, the terms "about" and "substantially" can indicate a value of a given quantity that varies within 5% of a target value (e.g., 1%, 2%, 3%, 4%, and 5% of the target value).

Gate structures infield effect transistors may extend two or more transistors. For example, the gate structures may be formed as long "lines" across the active regions of the substrate, such as the fin structures. Once the gate structures are formed, a patterning process "cuts" the long gate structure to shorter sections according to the desired layout. In other words, the patterning process removes redundant portions of the long gate structure and portions of interlayer dielectric (ILD) structure surrounding the long gate structure to form one or more "cuts" and separate the long line into shorter sections. This process may be referred to as a cut-metal-gate (CMG) process. Subsequently, the cuts formed between the separated sections of the long gate structure are filled with a gap fill structure, such as a dielectric material of silicon nitride, which has a dielectric constant of about 7.4. Silicon nitride not only electrically isolates adjacent sections of the long gate structure, but also protects the exposed gate structure layers from oxygen diffusion.

Since the gate structure is effectively an electrode embedded in one or more dielectric materials, it can form parasitic capacitors with active regions of the transistors—which in turn produce undesirable parasitic capacitances and fringing capacitances in an integrated circuit. Fringing capacitances, in addition to other parasitic capacitances present in the vicinity of the gate structure, slow down the ring oscillators (RO) of the integrated circuits and adversely impact the threshold voltage of the fabricated transistors.

The embodiments described herein are directed to a method for mitigating the fringing capacitances between the patterned gate structures and active regions. The fringing capacitance can be tuned by the profile of the gap fill structure, which can have a first portion in the gate structure and a second portion in the ILD structure surrounding the gate structure. In some embodiments, the fringing capacitance is reduced by decreasing the distance between the gate structure end and the active regions through increasing the width of the first portion of the gap fill structure in the gate structure. In some embodiments, the dimension of the second portion of the gap fill structure in the surrounding ILD structure is decreased to reduce the effective dielectric constant of the dielectric structure between the gate structure end and active regions. The interlayer dielectric structure can include a dielectric material of silicon oxide having a dielectric constant of about 3.9; reducing the dimension of the second portions of the gap fill structure filled with silicon nitride reduces the combined dielectric constant of the dielectric structure between the gate structure end and active regions (e.g., bring it closer to about 3.9).

According to some embodiments, FIG. 1 illustrates a partial isometric views of a gate structure 100 formed on fin structures 110 and separated by a gap fill structure 170 with profile control, in accordance with some embodiments. In some embodiments, fin structures 110 are disposed on a substrate 120. In some embodiments, gate structure 100 covers top and side surfaces of fin structure 110—which extend length-wise along the x-axis as shown by the dashed lines in FIG. 1. Fin structures 110 can be isolated by shallow trench isolation (STI) region 130. In some embodiments, epitaxial structures 140 are formed on a top surface of recessed portions of fin structures 110 which are not covered by gate structures 100. In some embodiments, epitaxial structures 140 can be formed on top and sidewall surfaces of non-recessed fin structures 110. In some embodiments, gate structure 100 can be isolated from epitaxial structures 140 via gate spacers 150. In referring to FIG. 1, gate structure 100 and epitaxial structures 140 are surrounded by an interlayer dielectric (ILD) structure 160 represented by a dashed line for ease of illustration. In some embodiments, a gap fill structure 170 can be formed in gate structure 100 and surrounding ILD structure 160 to separate gate structure 100 into two sections.

In some embodiments, additional gate structures, like gate structure 100, can be formed parallel to gate structure 100 on fin structures 110. These additional gate structures are not shown in FIG. 1 for simplicity. In some embodiments, FIG. 1 shows only a portion of an IC layout where the spacing between the fin structures (e.g., the fin pitch), the dimensions of the fin structures, and the dimensions of the gate structures can be similar or different from the ones shown in FIG. 1. Additionally, FIG. 1 and the subsequent figures are for illustrative purposes only and are not to scale. FIG. 1 and the subsequent figures may not reflect the actual geometry of the actual structures, features, or films. Some structures, films, or geometries may have been deliberately augmented for illustrative purposes.

In some embodiments, substrate 120 is a bulk semiconductor wafer or a top layer of a semiconductor on insulator (SOI) wafer such as, for example, silicon on insulator. Further, substrate 120 can be made of silicon (Si) or another elementary semiconductor such as (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. Further, substrate 120 can be doped depending on design requirements (e.g., p-type substrate or n-type substrate). In some embodiments, substrate 120 can be doped with p-type dopants (e.g., boron, indium, aluminum, or gallium) or n-type dopants (e.g., phosphorus or arsenic). In some embodiments, substrate 120 has a crystalline microstructure—e.g., it is not amorphous or polycrystalline.

Fin structures 110 shown in FIG. 1 may be formed on substrate 120 via patterning. For example, fin structures 110 may be patterned using one or more photolithography processes, including double-patterning or multi-patterning processes. Double-patterning or multi-patterning processes can combine photolithography and self-aligned processes, allowing patterns to be created that have, for example, a smaller pitch than what is otherwise obtainable using a single, direct photolithography process. For example, in some embodiments, a sacrificial layer is formed over a substrate (e.g., substrate 120) and patterned using a photolithography process. Spacers are formed alongside the patterned sacrificial layer using a self-aligned process. The sacrificial layer is then removed, and the remaining spacers may then be used to pattern fin structures 110. Fin structures 110 can be parallel to each other. In some embodiments, additional fin structures, like fin structures 110, can be formed parallel to fin structures 110 on substrate 120. These additional fin structures are not shown in show in FIG. 1 for simplicity.

In some embodiments, fin structures 110 are made of the same material as substrate 120, or different. By way of example and not limitation, fin structures 110 can be made of Si or another elementary semiconductor such as, for example, (i) Ge; (ii) a compound semiconductor including SiC, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof. In some embodiments, fin structures 110 have a crystalline microstructure—e.g., they are not amorphous or polycrystalline.

According to some embodiments, STI region 130 is deposited with a flowable chemical vapor deposition process (e.g., flowable CVD) to ensure that STI region 130 fills the space between fin structures 110 without forming seams or voids. In some embodiments, STI region 130 can have a dielectric material, such as silicon oxide, silicon nitride, silicon oxynitride, fluorine-doped silicate glass (FSG), a low-k dielectric material, and/or other suitable insulating materials. In some embodiments, STI region 130 is a silicon oxide based dielectric that includes, for example, nitrogen and/or hydrogen. To improve further its dielectric and structural properties, STI region 130 may be subjected to a wet steam anneal (e.g., 100% water molecules) at a temperature between about 800° C. and about 1200° C. During the wet steam anneal, STI region 130 densifies and its oxygen content may increase. STI region 130 can provide electrical isolation to fin structures from neighboring active and passive elements (not shown) integrated with or deposited onto substrate 120.

According to some embodiments, epitaxial structures 140 form the source and drain regions of the fin field effect transistors (FETs). By way of example and not limitation, depending on the type of transistor (e.g., n-type or p-type) epitaxial structures 140 can include: (i) boron (B) doped SiGe, B-doped Ge, or B-doped germanium tin (GeSn) for p-type transistors; and (ii) carbon-doped Si (Si:C), phosphorous doped Si (Si:P) or arsenic doped Si (Si:As) for n-type transistors. Epitaxial structures 140 can be in-situ doped during an epitaxial growth process using n-type dopants, such as phosphorous and arsenide, and p-type dopants, such as boron and indium. Further, epitaxial structures 140 may include multiple layers (e.g., two layers, three layers, or more) with different dopant concentration and/or crystalline microstructure, crystallographic orientation, etc.

In some embodiments, epitaxial structures 140 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial structures 140 can be grown by an epitaxial deposition/partial etch process, which repeats the epitaxial deposition/partial etch process at least once. Such repeated deposition/partial etch process is also called a cyclic deposition-etch (CDE) process. In some embodiments, epitaxial structures 140 can be grown by selective epitaxial growth (SEG), where an etching gas is added to promote the selective growth of semiconductor material on the exposed surfaces of fin structures 110, but not on insulating material (e.g., dielectric material of STI region 130).

Each of epitaxial structures 140 can be p-type or n-type. Each of p-type epitaxial structures 140 can include SiGe, Si, silicon germanium bromide (SiGeB), Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, or gallium. For p-type in-situ doping, p-type doping precursors, such as diborane ($B_2H_6$), boron trifluoride ($BF_3$), and/or other p-type doping precursors, can be used.

Each of p-type epitaxial structures 140 can include epitaxially grown p-type first, second, and third sub-regions (not shown), where the third sub-region can be grown on the second sub-region, and the second sub-region can be grown on the first sub-region. In some embodiments, the sub-regions can have SiGe and differ from each other based on, for example, doping concentration, epitaxial growth process conditions, and/or relative concentration of Ge with respect to Si.

In some embodiments, each of n-type epitaxial structures 140 can include Si, silicon phosphide (SiP), silicon carbide (SiC), silicon phosphorus carbide (SiPC), or III-V materials (e.g., indium phosphide (InP), gallium arsenide (GaAs), aluminum arsenide (AlAs), indium arsenide (InAs), indium aluminum arsenide (InAlAs), or indium gallium arsenide (InGaAs)) and can be in-situ doped during an epitaxial growth process using n-type dopants, such as phosphorus or arsenic. For n-type in-situ doping, n-type doping precursors, such as phosphine (PH), arsine ($AsH_3$), and/or other n-type doping precursor, can be used. Each of n-type epitaxial structures 140 can have multiple n-type sub-regions. Except for the type of dopants, the n-type sub-regions can be similar to the p-type sub-regions, in thickness, and/or dopant concentration. Other materials, thicknesses, and dopant concentrations for the n-type and/or p-type sub-regions are within the scope and spirit of this disclosure.

According to some embodiments, gate structure 100 includes several layers. By way of example and not limitation, gate structure 100 can include a dielectric stack 100a, work function stack 100b, and metal fill 100c, and other intervening layers not shown in FIG. 1 and the subsequent figures. In some embodiments, a hard mask layer can be formed on a top surface of gate structure 100 before the CMG process (not shown in FIG. 1). The hard mask layer can include a bottom metal nitride layer (e.g., titanium nitride) and a top silicon nitride layer. According to some embodiments, the hard mask layer can protect gate structure 100 during manufacturing process.

In some embodiments, dielectric stack 100a can include silicon oxide and can be formed by CVD, atomic layer deposition (ALD), physical vapor deposition (PVD), e-beam evaporation, or other suitable processes. In some embodiments, dielectric stack 100a can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric stack 100a can include a single layer or a stack of insulating material layers. Other materials and formation methods for dielectric stack 100a are within the scope and spirit of this disclosure.

Work function stack 100b can include a single metal layer or a stack of metal layers. The stack of metal layers can include metals having work function values equal to or different from each other. In some embodiments, work function stack 100b can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, work function stack 100b can include Al-doped metal, such as Al-doped Ti, Al-doped TiN, Al-doped Ta, or Al-doped TaN. Work function stack 100b can be formed using a suitable process such as ALD, CVD, PVD, plating, or combinations thereof. In some embodiments, work function stack 100b can have a thickness ranging from about 2 nm to about 15 nm. Other materials, formation methods and thicknesses for work function stack 100b are within the scope and spirit of this disclosure.

Metal fill 100c can include a single metal layer or a stack of metal layers. The stack of metal layers can include metals different from each other. In some embodiments, metal fill 100c can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAC), metal alloys, and/or combinations thereof. Metal fill 100c can be formed by ALD, PVD, CVD, or other suitable deposition processes. Other materials and formation methods for metal fill 100c are within the scope and spirit of this disclosure.

In some embodiments, gate structure 100 can further include a gate barrier layer (not shown). Gate barrier layer can serve as a nucleation layer for subsequent formation of work function stack 100b and/or can help to prevent substantial diffusion of metals (e.g., Al) from gate work function stack 100b to underlying layers (e.g., dielectric stack 100a). Gate barrier layer can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layer can include substantially fluorine-free metal or metal-containing film and can be formed by ALD or CVD using one or more non-fluorine based precursors. In some embodiments, gate barrier layer can have a thickness ranging from about 1 nm to about 10 nm. Other materials, formation methods and thicknesses for gate barrier layer are within the scope and spirit of this disclosure.

Gate spacers 150 can include insulating material, such as silicon oxide, silicon nitride, a low-k material, or a combination thereof. Gate spacers 150 can have a low-k material with a dielectric constant less than 3.9 (e.g., less than 3.5, 3, or 2.8). In some embodiments, each of gate spacers 150 can have a thickness in a range from about 5 nm to about 10 nm. Based on the disclosure herein, a person of ordinary skill in the art will recognize that other materials and thicknesses for gate spacers 150 are within the scope and spirit of this disclosure.

ILD structure 160 can be disposed on STI region 130 and surrounding gate structure 100. ILD structure 160 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD structure 160 can include silicon oxide, silicon nitride, silicon oxycarbide, zirconium oxide, hafnium oxide, or dielectric materials with high-k, low-k (e.g., k-value in a range from about 3.9 to about 3.0) or extreme low-k (e.g., k-value in a range from about 2.9 to about 2.0). In some embodiments, ILD structure 160 can have a thickness along a z-axis in a range from about 50 nm to about 200 nm.

According to some embodiments, gap fill structure 170 can be disposed in gate structure 100 and surrounding ILD structure 160. In some embodiments, gap fill structure 170 can include a first portion 170a in gate structure 100 and a second portion 170b in surrounding ILD structure 160. A cut is formed during the CMG process to separate gate structure 100 into multiple sections along the y-axis, which can be filled with dielectric materials subsequently to form gap fill structure 170. This is done, for example, to form individual transistors (not shown in FIG. 1), and/or a series of transistors, like transistors 102 and 104 in FIG. 1, by utilizing sections of the same original gate structure 100. This practice provides better process control over other fabrication methods where a larger number of shorter gate structures are formed at once. By way of example and not limitation, forming cuts can reduce process related variability (e.g., during patterning, layer deposition, planarization, etc.) when multiple shorter gate structures are formed. Further, by dividing a long gate structure with one or more cuts, a large group of transistors can be formed from sections of the same original gate structure—which can reduce the performance variability across the transistors. In some embodiments, additional gap fill structures, may be formed in gate structure 100 and/or additional gate structures of the integrated circuit as necessary. These additional gap fill structures are not shown in FIG. 1 for simplicity.

According to some embodiments, gap fill structure 170 can include silicon nitride, bi-layer stack of silicon nitride and silicon oxide, and/or other suitable dielectric materials. During the CMG process, the cut is formed as an "opening" in gate structure 100 and ILD structure 160 which exposes the top surface of STI region 130 and the end faces of gate structure 100. Consequently, dielectric stack 100a, work function stack 100b and metal fill 100c are exposed within the opening. According to some embodiments, gap fill structure 170 is filled to cover the end faces of gate structure 100 and to protect the exposed layers of gate structure 100. In some embodiments, gap fill structure 170 acts as a barrier that prevents oxygen diffusion into the layers of gate structure 100 (e.g., dielectric stack 100a and work function stack 100b). Sources of oxygen species are, for example, the oxide layers in the vicinity of gate structure 100 (e.g., ILD structure 160). Oxygen diffusion is undesirable since it causes unintentional and uncontrollable threshold voltage shifts in the fabricated transistors. According to some embodiments, gap fill structure 170 also acts an electrical isolation structure between different sections of gate structure 100.

Figures 2A, 2B:
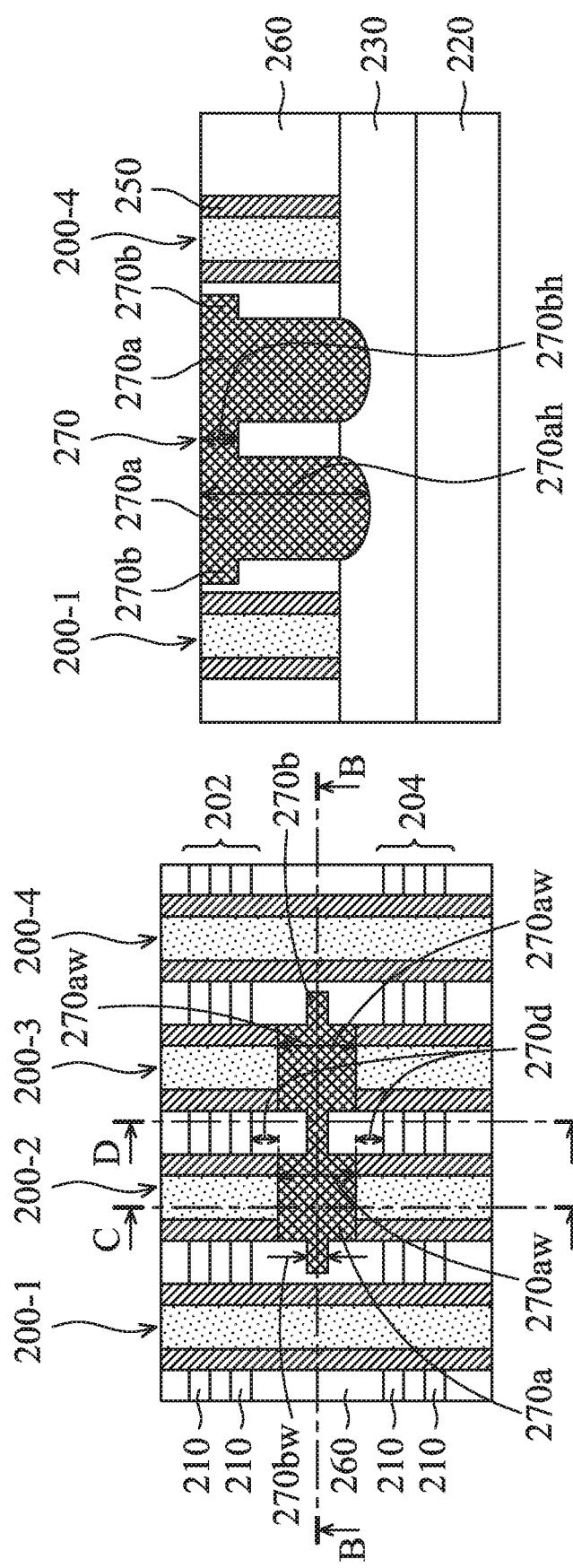
FIGS. 2A-2D are partial top and cross sectional views of gate structures separated by a gap fill structure with profile control, in accordance with some embodiments.
Figure 2D:
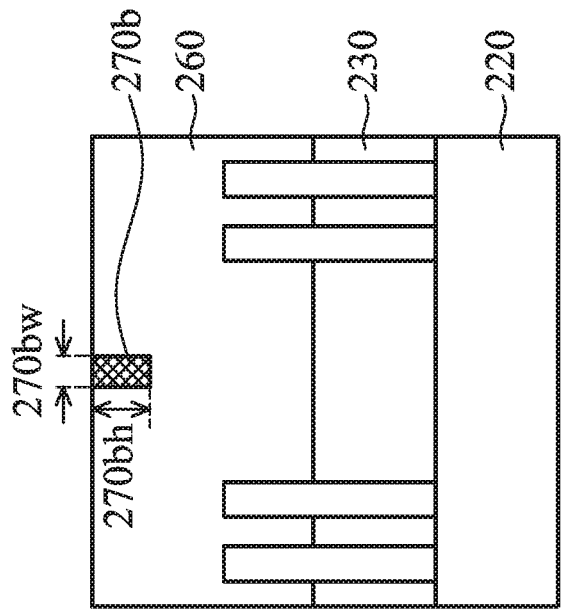
Figure 2C:
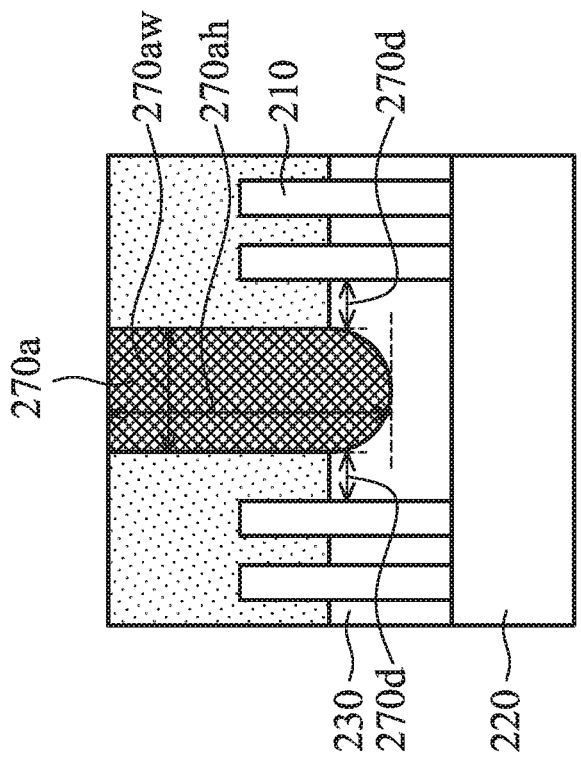

FIG. 2A illustrates a partial top view of gate structures 200-1, 200-2, 200-3, and 200-4 separated by a gap fill structure 270 with profile control, in accordance with some embodiments. Gap fill structure 270 can be formed in gate structures 200-2 and 200-3 as well as surrounding ILD structure 260. Gate structures 200-2 and 200-3 can be separated into two sections over fin structures 110 of transistors 202 and 204 respectively. FIGS. 2B-2D illustrate partial cross sectional views along lines B-B, C-C, and D-D of gap fill structure 270 in FIG. 2A, in accordance with some embodiments. Epitaxial structures have been purposely omitted in FIGS. 2A-2D and subsequent figures for the sake of clarity. In some embodiments, FIG. 2B is a cross section along a direction parallel to fin structures 210, and is referred to as "X-cut". Respectively, FIGS. 2C and 2D are cross sections along the direction of gate structure through gate structure 200-2 and ILD structure between gate structures 200-2 and 200-3, and are therefore referred to as "Y-cut" in gate structure and "Y-cut" in ILD structure respectively.

In referring to FIG. 2A-2D, gap fill structure 270 can include a first portion 270a in gate structures 200-2 and 200-3 and a second portion 270b in surrounding ILD structure 260, according to some embodiments. In some embodiments, with profile control, first portion 270a can have a first width 270aw along a y-axis ranging from about 30 nm to about 35 nm, and a first height 270ah along a z-axis ranging from about 160 nm to about 180 nm. In some embodiments, with profile control, second portion 270b can have a second width 270bw along a y-axis ranging from about 8 nm to about 12 nm, and a second height 270bh along a z-axis ranging from about 10 nm to about 20 nm.

In some embodiments, first width 270aw can be larger with profile control, which can reduce a gate end to fin distance 270d along a y-axis between the end of gate structures 200-2 and 200-3 and adjacent fin structures 210. In some embodiments, with profile control, first width 270aw can be at least two times larger than second width 270bw. In some embodiments, with profile control, a ratio between first width 270*aw* and second width 270*bw* can range from about 2 to about 5. If the ratio is smaller than 2, second width 270*bw* may be too large and the fringing capacitance may not be reduced. On the other hand, if the ratio is larger than about 5, second width may be too small and forming gap fill structure 270 may be difficult. In some embodiments, with profile control, a ratio between first height 270*ah* and second height 270*bh* can range from about 5 to about 20. If the ratio is smaller than about 5, the fringing capacitance may not be reduced. On the other hand, if the ratio is larger than about 20, second height 270*bh* may be too small and forming gap fill structure 270 may be difficult.

According to some embodiments, profile control of gap fill structure 270 reduces fringing capacitance between gate structures 200-2 and 200-3 and adjacent fin structures 210 in several aspects. First, reducing gate end to fin distance 270*d* can reduce the fringing capacitance between gate structures 200-2 and 200-3 and adjacent fin structures 210. Second, with profile control, smaller second width 270*bw* and smaller second height 270*bh* can reduce the volume of second portion 270*b* of gap fill structure 270. Because, without profile control, first portion 270*a* and second portion 270*b* of gap fill structure 270 have similar dimensions. And because gap fill structure 270 has a larger dielectric constant (e.g., about 7.4 for silicon nitride) than ILD structure 160 (e.g., about 3.9 for silicon oxide), a smaller volume of second portion 270*b* of gap fill structure 270 can reduce the effective dielectric constant (k-value) of the dielectric structure between gate structures 200-2 and 200-3 and adjacent fin structures 210, and thus reduce the fringing capacitance.

Figure 3:
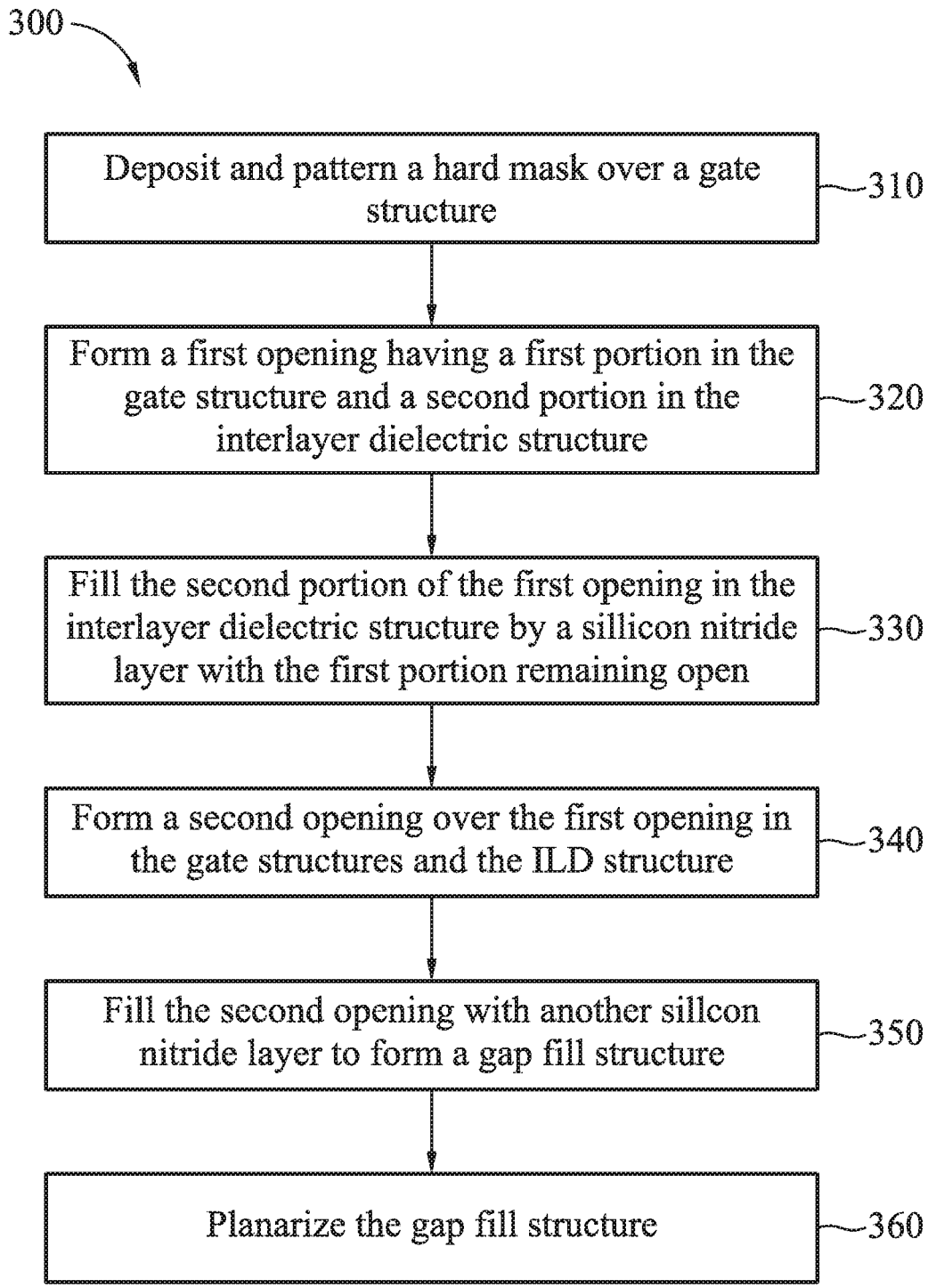
FIG. 3 is a flow chart of a method for the formation of a gap fill structure with profile control, in accordance with some embodiments.
Figure 4B:
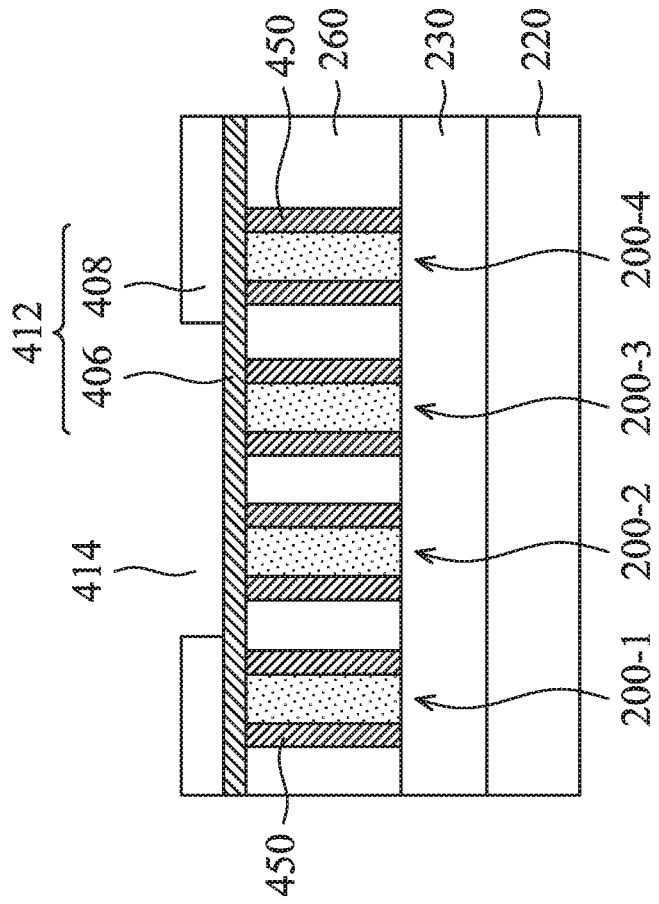
Figure 4A:
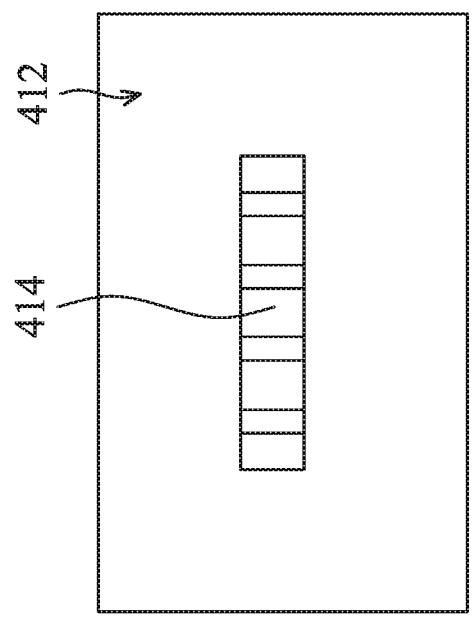
Figure 4D:
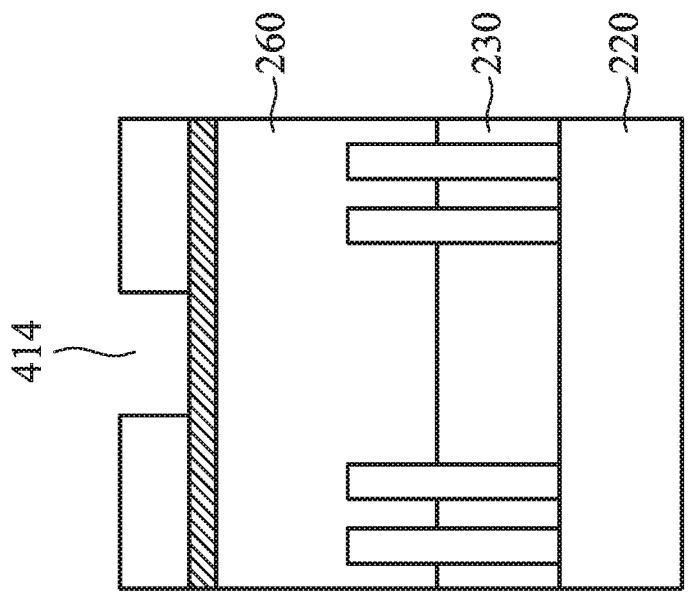
Figure 4D:
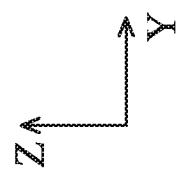
Figure 4C:
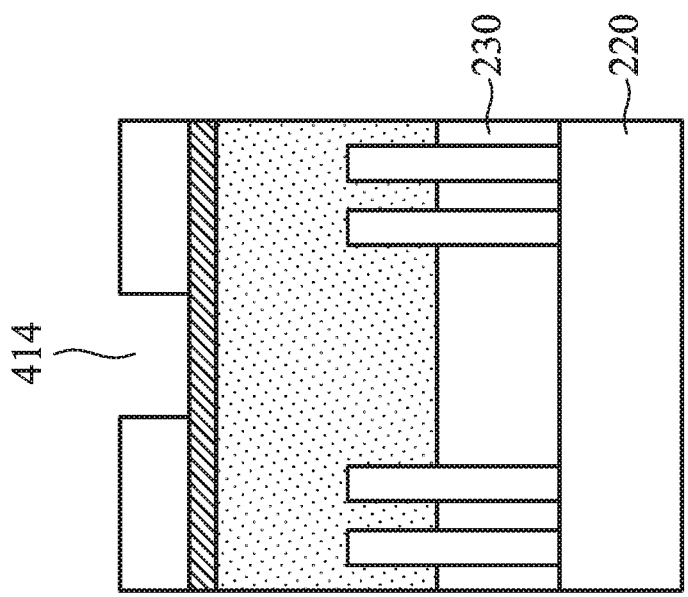
Figure 4C:
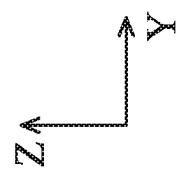

FIG. 3 is a flow chart of a fabrication method 300 describing the formation of a gap fill structure with profile control, according to some embodiments. Additional fabrication operations may be performed between the various operations of method 300 and may be omitted merely for clarity and ease of description. These various operations are within the spirit and the scope of this disclosure. Moreover, not all operations may be required to perform the disclosure provided herein. Additionally, some of the operations may be performed simultaneously, or in a different order than the ones shown in FIG. 3. Accordingly, it is understood that additional processes can be provided before, during, and/or after method 300, and that some other processes may only be briefly described herein. For illustrative purposes, method 300 will be described with reference to the embodiments shown in FIGS. 1, 2, and 4-8 and the example fabrication process illustrated in FIGS. 4-7. FIGS. 4A-7A, 4B-7B, 4C-7C, and 4D-7D are top views and cross sectional views along lines B-B, C-C, and D-D as in FIG. 2 at various stages of their fabrication process, according to some embodiments. The figures provided to describe method 300 are for illustrative purposes only and are not to scale. In addition, the figures may not reflect the actual geometry of the actual structures, features, or films. Some structures, films, or geometries may have been deliberately augmented for illustrative purposes.

In referring to FIG. 3, method 300 begins with operation 310 and the process of depositing and patterning a hard mask over a gate structure. For example, as shown in FIGS. 4A-4D, a hard mask 412 is formed and patterned so that opening 414 over gate structures 200-2 and 200-3 and ILD structure 260 is formed within the hard mask material. In some embodiments, hard mask 412 can include two sub-layers 406 and 408 as shown in FIGS. 4A-4D. In some embodiments, sub-layer 406 is an etch stop layer, which is deposited on the ILD structure 260 and gate structures 200-1, 200-2, 200-3, and 200-4. In some embodiments, sub-layer 406 is a titanium nitride layer, or other suitable material that can act as an etch stop layer during subsequent planarization of gap fill structure 270. In some embodiments, sub-layer 406 can have a thickness along a z-axis ranging from about 4 nm to about 8 nm. In some embodiments, sub-layer 408 can be a photoresist material, which is spin-coated on sub-layer 406 and then patterned. In some embodiments, sub-layer 408 is a silicon nitride layer, or any other suitable material that can act as an etch mask and prevent masked regions of gate structures 200-1 to 200-4 and ILD structures 260 from being etched. In some embodiments, sub-layer 408 can have a thickness along a z-axis ranging from about 30 nm to about 60 nm.

In referring to FIG. 3, method 300 continues with operation 320 and the process of forming a first opening in the gate structure and surrounding ILD structure through the patterned hard mask. For example, as described with reference to FIGS. 5A-5D, first opening 516 can be formed in gate structures 200-2 and 200-3 and surrounding ILD structure 260. First opening 516 can include a first portion 516*a* in gate structures 200-2 and 200-3, and a second portion 516*b* in ILD structure 260. In some embodiments, first portion 516*a* can have a width 516*aw* along a y-axis ranging from about 20 nm to about 25 nm and a height 516*bh* in gate structures 200-2 and 200-3 along a z-axis ranging from about 30 nm to about 50 nm. In some embodiments, second portion 516*b* can have a width 516*bw* along a y-axis ranging from about 8 nm to about 12 nm and a height 516*bh* in ILD structure 260 along a y-axis ranging from about 10 nm to about 20 nm.

In some embodiments, first opening 516 can be formed by dry etching. The etching process can include several etching operations with each having appropriate etching gas chemistries. In some embodiments, the dry etching process used for the formation of opening 516 can include a directional dry etching process. In some embodiments, the directional dry etching process can include using chlorine-based etchants, such as silicon tetrachloride ($SiCl_4$) and chlorine ($Cl_2$). The directional dry etching process can be performed at a temperature ranging from about 50° C. to about 150° C. In some embodiments, the directional dry etching process can have different etch rates between metal and oxide.

Figure 5B:
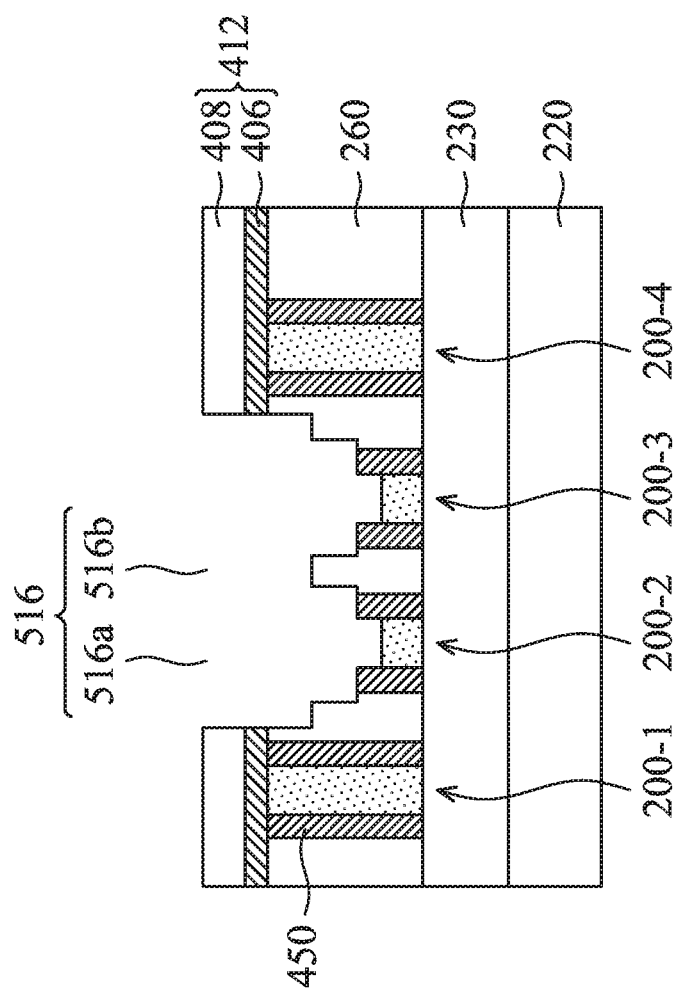
Figure 5A:
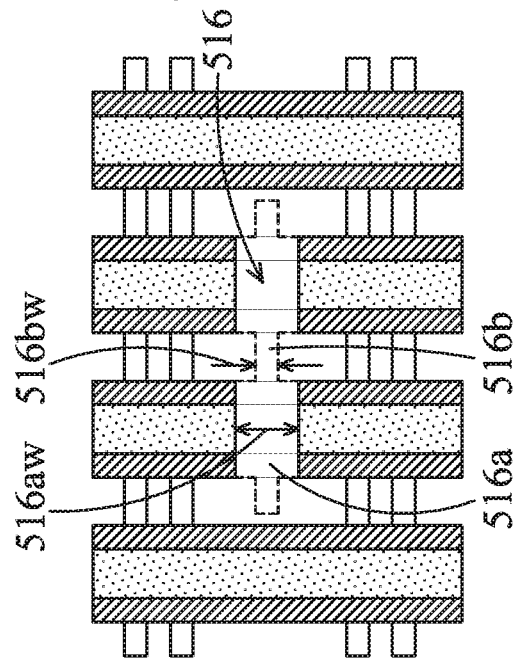
Figure 5D:
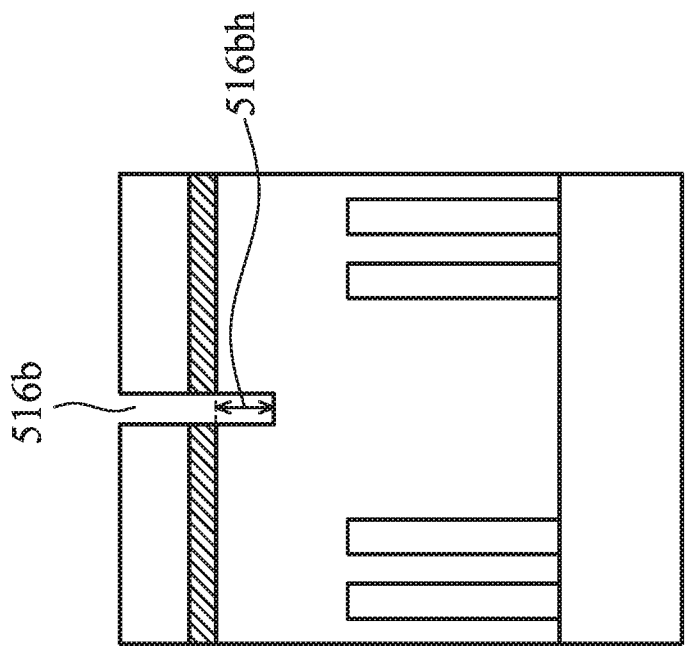
Figure 5C:
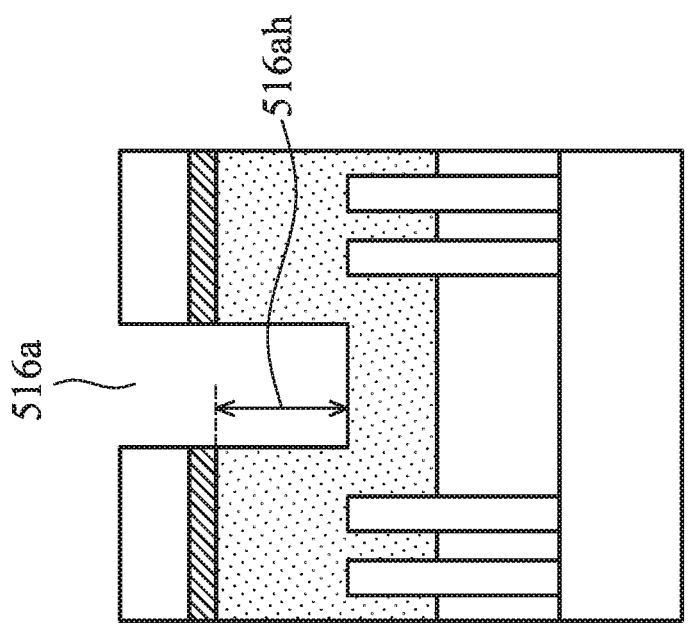
Figure 6D:
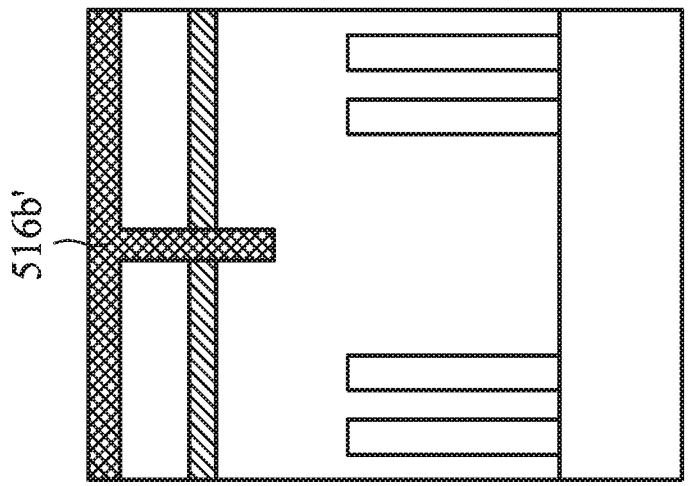
Figure 6C:
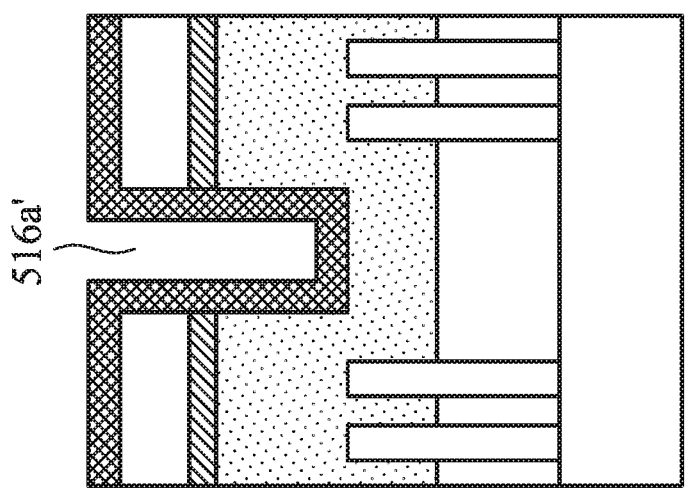
Figure 7B:
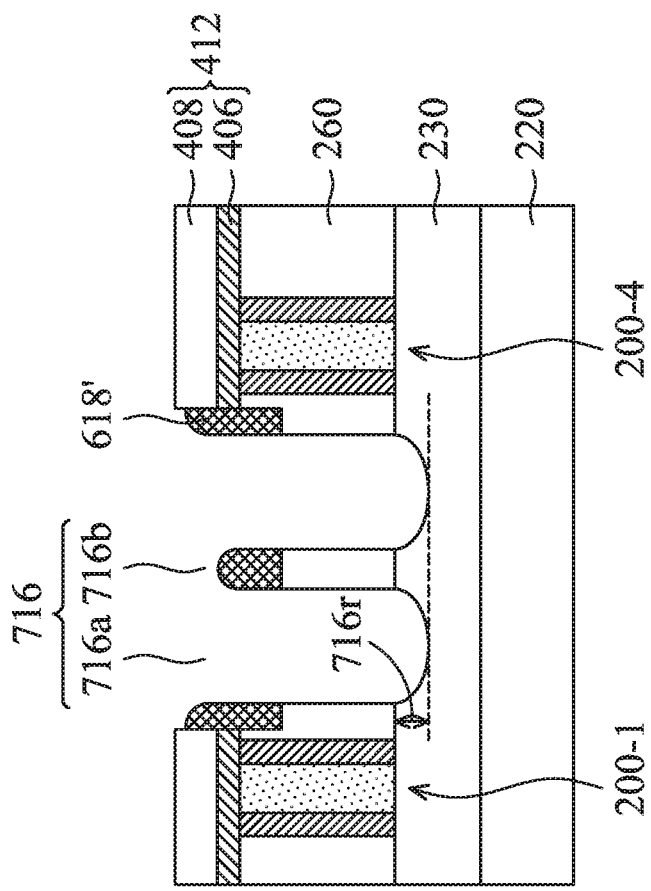
Figure 7A:
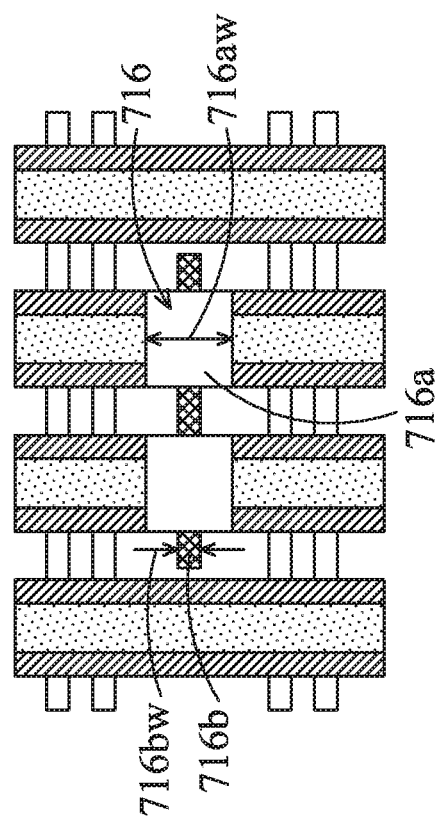
Figure 7D:
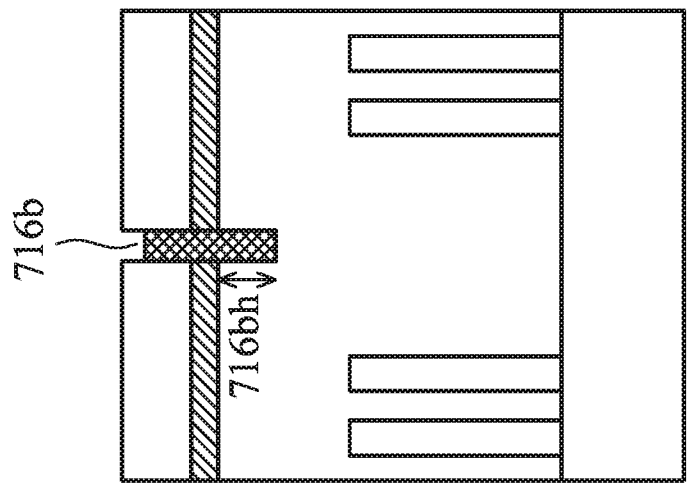
Figure 7C:
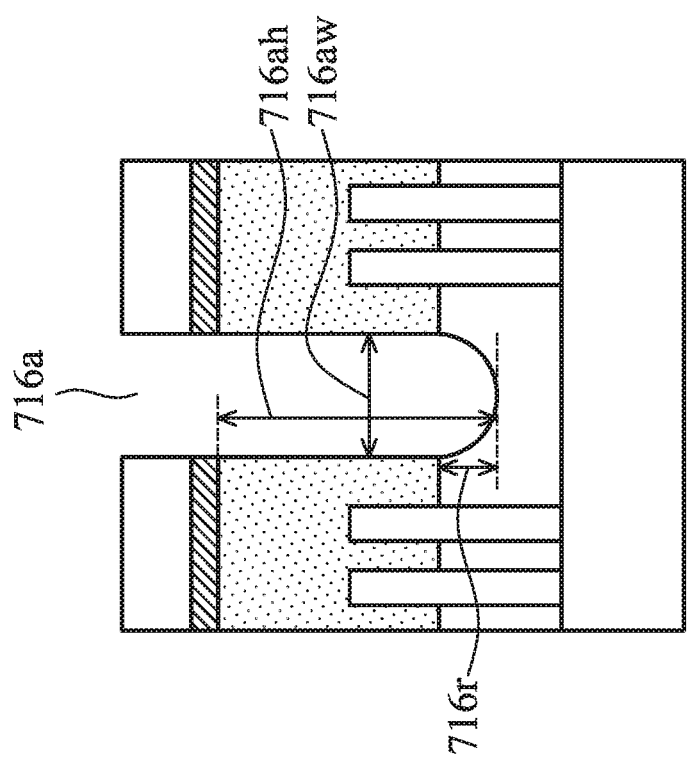

In some embodiments, gate structures 200-2 and 200-3 and ILD structure 260 can be selectively etched via the directional dry etching process to form first opening 516. In some embodiments, gate structures 200-2 and 200-3 can include metal and have a first etch rate. In some embodiments, gate spacers 450 can have a smaller etch rate than gate structures 200-2 and 200-3, resulting in first opening 516 profile as shown in FIG. 5B. ILD structure 260 can include silicon oxide and have a second etch rate. A ratio between the first etch rate and the second etch rate can range from about 2.5 to about 3. Higher etch rate for gate structures 200-2 and 200-3 than ILD structure 260 can form opening 516 having larger width and height in gate structures 200-2 and 200-3. If the ratio is smaller than about 2.5, opening 516 formed by the selective etch may have similar width and height dimensions between first portion 516*a* and 516*b*, which may not be appropriate for a subsequent filling process. If the ratio is greater than about 3, width and height dimensions of opening 516 can have better control, though it is harder to tune the etch rate ratio to be higher than about 3. In some embodiments, gate structures 200-2 and 200-3 are partially etched such that opening 516 does not separate gate structures 200-2 and 200-3 (referred to as a "partial dry etch").

Referring to FIG. 3, method 300 continues with operation 330 and the process of filling the second portion of the first opening in the interlayer dielectric structure by a silicon nitride layer with the first portion remaining open. For example, as described with reference to FIGS. 5A-5D and 6A-6D, a silicon nitride layer 618 can be blanket deposited in first opening 516 and fill second portion 516b of first opening 516 while second portion 516b of first opening 516 remains open (referred to as a "self-merge"). In some embodiments, the silicon nitride layer can be blanket deposited by an ALD process using reaction gases, such as dichlorosilane ($SiH_2Cl_2$) and nitrogen as precursors at a temperature ranging from about 400° C. to about 420° C. In some embodiments, silicon nitride layer 618 can have a thickness ranging from about 5 nm to about 7 nm. As first portion 516a of opening 516 has a larger width and depth than second portion 516b, silicon nitride layer 618 can fill second portion 516b of opening 516 and first portion 516a can remain open after the filling process. By way of example and not limitation, second portion 516b of opening 516 has a smaller width than first portion 516a and can be difficult to fill. For this reason, it is important that silicon nitride layer 618 is deposited with a process that can produce conformal films, such as an ALD-based process.

In referring to FIG. 3, method 300 continues with operation 340 and the process of forming a second opening over the first opening in the gate structures and ILD structure. For example, as described with reference to FIGS. 6A-6D and 7A-7D, second opening 716 can be formed over first opening 516' in gate structures 200-2 and 200-3 and ILD structure 260. In some embodiments, gate structures 200-2 and 200-3 and ILD structure 260 can be selectively etched to form second opening 716. Second opening 716 can include a first portion 716a in gate structures 200-2 and 200-3 and a second portion 716b in ILD structure 260. In some embodiments, first portion 716a can have a width 716aw along a y-axis ranging from about 30 nm to about 35 nm and a height 716ah in gate structures 200-2 and 200-3 along a z-axis ranging from about 160 nm to about 180 nm. Height 716ah of second opening 716 can be larger than height 516ah of first opening 516 to separate gate structures 200-2 and 200-3 into two sections respectively (referred to as a "fully dry etch"). In some embodiments, after forming second opening 716, the separation of gate structures 200-2 and 200-3 can be a complete separation, which means there is no electrical conductivity between the separated two sections. In some embodiments, first portion 716a of second opening 716 can extend into STI region 230 to separate gate structures with a recess 716r along a z-axis ranging from about 20 nm to about 200 nm. In some embodiments, with recess 716r, gate structures 200-2 and 200-3 can be completely separated, which means there is no electrical conductivity between these two sections. In some embodiments, second portion 716b can have a width 716bw along a y-axis ranging from about 8 nm to about 12 nm and a height 716bh in ILD structure 260 along a z-axis ranging from about 10 nm to about 20 nm.

In some embodiments, second opening 716 can be formed by the directional dry etching process used to form first opening 516. In some embodiments, gate structures 200-2 and 200-3 and silicon nitride layer 618 can be selectively etched via the directional dry etching process to form second opening 716. In some embodiments, silicon nitride layer 618 can have a third etch rate. A ratio between the first etch rate and the third etch rate can range from about 4 to about 6. If the ratio is lower than about 4, ILD structure 260 below nitride layer 618 can be etched off more, which is undesirable for smaller dimensions for second portion 716b. If the ratio is greater than about 3, width and height dimensions of opening 516 can have better control, though it is harder to tune the etch rate ratio to be higher than about 6.

As shown in FIGS. 6A-6D, first portion 516a' of opening 516' after the self-merge process remains open, so etching gases can enter first portion 516a' of opening 516' and etch nitride layer 618 and remaining gate structures 200-2 and 200-3 to form first portion 716a of second opening 716. However, second portion 516b' of opening 516' after the self-merge process is filled, etching gases may not enter second portion 516b'; thus mainly a top portion of silicon nitride layer 618 in second portion 516b' can be removed. In some embodiments, about 30 nm to about 40 nm of silicon nitride layer 618 in second portion 516b' can be removed during formation of the second opening.

In referring to FIG. 3, method 300 continues with operation 350 and the process of filling the second opening with another silicon nitride layer to form a gap fill structure. And in operation 360 of method 300, the gap fill structure is planarized. For example, as described with reference to FIGS. 7A-7D and 2A-2D, second opening 716 can be filled with another silicon nitride layer and gap fill structure 270 can be formed. In some embodiments, the planarization process includes a chemical mechanical polishing (CMP) process that removes the silicon nitride layer deposited in second opening 716 and on hard mask 412. In some embodiments, a top portion of gate structures 200-1 to 200-4 is also removed during the planarization process. By way of example and not limitation, the top and cross sectional views of FIGS. 2A-D show the resulting structure after the planarization process of operation 360.

Figure 8:
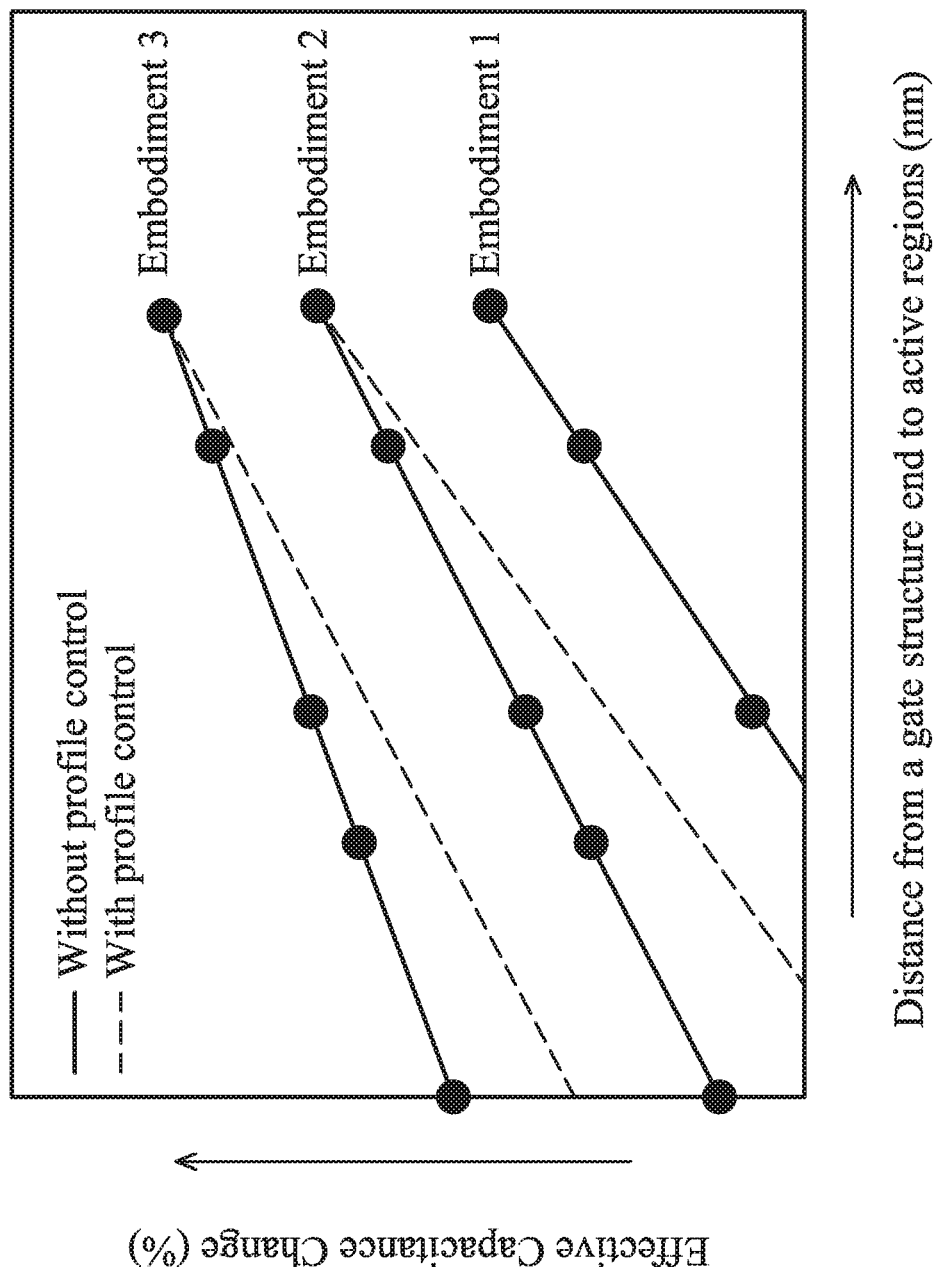
FIG. 8 is a chart illustrating a relationship between effective capacitance change and distance from a gate structure end to active regions without and with profile control of a gap fill structure, in accordance with some embodiments.

FIG. 8 is a chart illustrating a relationship between effective capacitance change and distance from a gate structure end to active regions without and with profile control of the gap fill structure, according to some embodiments. As shown in FIG. 8, effective capacitance decreases with the distance from a gate structure end to active regions for embodiments 1, 2, and 3. In some embodiments, embodiment 1 can be silicon oxide. In some embodiments, embodiment 2 can be bi-layer of silicon nitride and silicon oxide. In some embodiments, embodiment 3 can be silicon nitride. Effective capacitance further decreases with profile control of the gap fill structure for embodiments 2 and 3, compared with no profile control. As discussed above, the profile of gap structure 270 can be controlled by different etch rates for gate structures 200-2 and 200-3, ILD structure 260, and silicon nitride layer 618, according to some embodiments. With the higher etch rate of gate structures, first portion 270a of gap fill structure 270 can have a first width 270aw about 2 to about 5 times larger than second width 270bw for second portion 270b of gap fill structure 270. The larger first width 270aw can reduce gate end to fin distance 270d between the end of gate structures 200-2 and 200-3 and adjacent fin structures, which can reduce the fringing capacitance. With the higher etch rate of gate structures, first portion 270a of gap fill structure 270 can also have first height 270ah about 5 to about 20 times larger than second height 270bh for second portion 270b of gap fill structure 270, which can reduce the volume of second portion 270b of gap fill structure 270, thus reducing the effective dielectric constant and fringing capacitance.

The embodiments described herein are directed to a method for mitigating the fringing capacitances between patterned gate structures and active regions. The fringing capacitance can be tuned by the profile of the gap fill structure, which can have a first portion in the gate structure and a second portion in the ILD structure surrounding the gate structure. In some embodiments, the fringing capacitance is reduced by decreasing the distance between the gate structure end and the active regions through increasing the width of the first portion of the gap fill structure in the gate structure. In some embodiments, the dimension of the second portion of the gap fill structure in the surrounding ILD structure is decreased to reduce the effective dielectric constant of the dielectric structure between the gate structure end and active regions. The interlayer dielectric structure can include a dielectric material of silicon oxide having a dielectric constant of about 3.9. The gap fill structure can include a dielectric material of silicon nitride having a dielectric constant of about 7.4. The dielectric structure between the gate structure end and active regions is combined with the interlayer dielectric structure and the second portions of the gap fill structure. Reducing the dimension of the second portions of the gap fill structure reduces the combined dielectric constant of the dielectric structure between the gate structure end and active regions (e.g., bring it closer to about 3.9). In some embodiments, the profile of the gap fill structure is controlled by different etching rates for the gate structures, the ILD structure, and the silicon nitride layer. Is some embodiments, the profile of the gap fill structure is controlled through a partial dry etch and self-merge of the second portion of an opening in the ILD structure. In some embodiments, the profile of the gap fill structure is defined by the opening formed after a fully dry etch of the gate structures.

In some embodiments, a method includes forming a gate structure over a substrate, forming an interlayer dielectric structure surrounding the gate structure, and forming a first opening in the gate structure and the interlayer dielectric structure. The first opening has a first portion in the gate structure and a second portion in the interlayer dielectric structure, and the first portion has a width larger than the second portion. The method further includes depositing a dielectric layer in the first opening and forming a second opening over the first opening. The first portion of the first opening remains open and the second portion of the first opening is filled after depositing the dielectric layer. The second opening in the gate structure has a depth larger than the first opening in the gate structure.

In some embodiments, a method includes forming first and second fin structures on a substrate, forming a gate structure on the first and second fin structures, forming an interlayer dielectric structure surrounding the gate structure and over the first and second fin structures, and forming a first opening in the gate structure and the interlayer dielectric structure. The first opening has a first portion in the gate structure and a second portion in the interlayer dielectric structure and the first portion has a width larger than the second portion. The method further includes depositing a dielectric layer in the first opening, forming a second opening over the first opening, and forming a gap fill structure in the second opening. The first portion of the first opening remains open and the second portion of the opening is filled after depositing the dielectric layer. The second opening in the gate structure has a depth larger than the first opening in the gate structure.

In some embodiments, a semiconductor structure includes first and second fin structures over a substrate, a gate structure disposed on the first and the second fin structures, an interlayer dielectric structure surrounding the gate structure and over the first and the second fin structures, and a gap fill structure having a first portion formed in the gate structure and a second portion formed in the interlayer dielectric structure. The first and second fin structures are parallel to each other. A first width of the first portion of the gap fill structure is at least two times larger than a second width of the second portion of the gap fill structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate structure over a substrate;
   forming an interlayer dielectric structure surrounding the gate structure;
   forming a first opening in the gate structure and the interlayer dielectric structure, wherein the first opening has a first portion in the gate structure and a second portion in the interlayer dielectric structure, the first portion having a width larger than the second portion;
   depositing a dielectric layer in the first opening, wherein the first portion of the first opening remains open and the second portion of the first opening is filled; and
   forming a second opening over the first opening, wherein the second opening in the gate structure has a depth larger than the first opening in the gate structure.

2. The method of claim 1, wherein the forming the first opening comprises selectively etching the gate structure and the interlayer dielectric structure.

3. The method of claim 2, wherein the selectively etching the gate structure and the interlayer dielectric structure comprises:
   etching the gate structure at a first etch rate; and
   etching the interlayer dielectric structure at a second etch rate, wherein a ratio between the first etch rate to the second etch rate ranges from about 2.5 to about 3.

4. The method of claim 1, wherein the depositing the dielectric layer comprises conformally depositing a nitride layer in the first opening until the second portion of the opening is filled.

5. The method of claim 4, wherein the nitride layer comprises silicon nitride, the gate structure comprises metal, and the interlayer dielectric structure comprises silicon oxide.

6. The method of claim 1, wherein the forming the second opening comprises:
   selectively etching the gate structure and the interlayer dielectric structure over the first opening; and
   separating the gate structure into two sections.

7. The method of claim 6, wherein the selectively etching the gate structure and the interlayer dielectric structure comprises:
   etching the gate structure at a first etch rate; and etching the dielectric layer at a second etch rate, wherein a ratio between the first etch rate to the second etch rate ranges from about 4 to about 6.

8. The method of claim 1, further comprising filling the second opening with a gap fill structure.

9. The method of claim 8, wherein filling the second opening comprises depositing a nitride layer in the second opening.

10. A method, comprising:
forming first and second fin structures on a substrate;
forming a gate structure on the first and second fin structures;
forming an interlayer dielectric structure surrounding the gate structure and over the first and second fin structures;
forming a first opening in the gate structure and the interlayer dielectric structure, wherein the first opening has a first portion in the gate structure and a second portion in the interlayer dielectric structure and the first portion has a width larger than the second;
depositing a dielectric layer in the first opening, wherein the first portion of the first opening remains open and the second portion of the opening is filled;
forming a second opening over the first opening, wherein the second opening in the gate structure has a depth larger than the first opening in the gate structure; and
forming a gap fill structure in the second opening.

11. The method of claim 10, wherein the forming the first opening comprises:
etching the gate structure at a first etch rate; and
etching the interlayer dielectric structure at a second etch rate, wherein a ratio between the first etch rate to the second etch rate ranges from about 2.5 to about 3.

12. The method of claim 10, wherein the depositing the dielectric layer comprises conformally depositing a nitride layer in the first opening until the second portion of the opening is filed.

13. The method of claim 12, wherein forming the second opening comprises selectively etching the gate structure and the interlayer dielectric structure to separate the gate structure into two sections.

14. The method of claim 13, wherein the selectively etching the gate structure and the interlayer dielectric structure comprises:
etching the gate structure at a first etch rate; and
etching the nitride layer at a second etch rate, wherein a ratio between the first etch rate to the second etch rate ranges from about 4 to about 6.

15. The method of claim 10, wherein the forming the gap fill structure comprises depositing a nitride in the second opening to fill the second opening.

16. A semiconductor structure, comprising:
first and second fin structures over a substrate, wherein the first and second fin structures are parallel to each other;
a gate structure disposed on the first and the second fin structures;
an interlayer dielectric structure surrounding the gate structure and over the first and the second fin structures; and
a gap fill structure having a first portion formed in the gate structure and a second portion formed in the interlayer dielectric structure, wherein a first width of the first portion of the gap fill structure is larger than a second width of the second portion of the gap fill structure and a first height of the first portion of the gap till structure is larger than a second height of the second portion of the gap fill structure.

17. The semiconductor structure of claim 16, wherein a ratio of the first width to the second width ranges from about 2 to about 5.

18. The semiconductor structure of claim 16, wherein the gap fill structure separates the gate structure into first and second sections over the first and second fin structures, respectively.

19. The semiconductor structure of claim 16, wherein a ratio of the first height of the first portion to the second height of the second portion ranges from about 5 to about 20.

20. The semiconductor structure of claim 16, wherein the gate structure comprises metal, the interlayer dielectric structure comprises silicon oxide, and the gap fill structure comprises silicon nitride.

* * * * *